(12) United States Patent
Okamoto

(10) Patent No.: US 12,140,874 B2
(45) Date of Patent: Nov. 12, 2024

(54) DRIVING APPARATUS, EXPOSURE APPARATUS, AND ARTICLE MANUFACTURING METHOD

(71) Applicant: CANON KABUSHIKI KAISHA, Tokyo (JP)

(72) Inventor: Tomohiro Okamoto, Ibaraki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 151 days.

(21) Appl. No.: 17/885,607

(22) Filed: Aug. 11, 2022

(65) Prior Publication Data

US 2023/0060389 A1 Mar. 2, 2023

(30) Foreign Application Priority Data

Aug. 26, 2021 (JP) .................................. 2021-138249

(51) Int. Cl.
*G03F 7/00* (2006.01)
*G02B 7/02* (2021.01)
(Continued)

(52) U.S. Cl.
CPC ........... *G03F 7/70825* (2013.01); *G02B 7/02* (2013.01); *H02K 41/0352* (2013.01); *G02B 27/0025* (2013.01)

(58) Field of Classification Search
CPC ........ G03F 7/70825; G03F 7/70; G03F 7/708; G03F 7/70808; G03F 7/70816; G03F 7/70833; G03F 7/70858; G03F 7/709; G03F 7/7095; G03F 7/70975; G03F 7/70258; G03F 7/70316; G03F 7/70141; G03F 7/7015; G03F 7/70758; G03F 7/70766;
(Continued)

(56) References Cited

U.S. PATENT DOCUMENTS 6,556,364 B2 * 4/2003 Meehan .................. G03F 7/708
359/813
2003/0213889 A1 * 11/2003 Miura ...................... G03F 7/707
248/683
(Continued)

FOREIGN PATENT DOCUMENTS

| JP | 10206714 A | * | 8/1998 | ......... G03F 7/70825 |
| JP | 2001267234 A | * | 9/2001 | ............ G03F 7/708 |
| JP | 2004-031491 A | | 1/2004 | |

OTHER PUBLICATIONS

English translation of JP10-206714, published Aug. 7, 1998. (Year: 1998).*

(Continued)

*Primary Examiner* — Christina A Riddle
(74) *Attorney, Agent, or Firm* — Carter, DeLuca & Farrell LLP

(57) ABSTRACT

A driving apparatus includes a holding member configured to hold an object to be driven, a support member configured to support the holding member via an elastic member, a plurality of actuators configured to drive the holding member holding the object, and a constrainer configured to constrain, in a non-contact manner, a position of the holding member with respect to the support member in a non-driving direction different from a drivable direction which is a direction in which the holding member can be driven by the plurality of actuators.

20 Claims, 4 Drawing Sheets

(51) Int. Cl.
*H02K 41/035* (2006.01)
*G02B 27/00* (2006.01)

(58) Field of Classification Search
CPC ... G03F 7/70775; G03F 7/70783; G02B 7/02; G02B 27/0025; H02K 41/0352
USPC .................................. 355/30, 52–55, 67–77
See application file for complete search history.

(56) References Cited

U.S. PATENT DOCUMENTS

| | | | | |
|---|---|---|---|---|
| 2005/0002011 | A1* | 1/2005 | Sudoh | G03F 7/706 355/72 |
| 2005/0083508 | A1* | 4/2005 | Hage | G03F 7/70816 355/72 |
| 2006/0082907 | A1* | 4/2006 | Murasato | G02B 7/026 359/819 |
| 2009/0009742 | A1* | 1/2009 | Arai | G02B 7/02 355/55 |

OTHER PUBLICATIONS

English translation of JP-2001267234, published Sep. 28, 2001. (Year: 2001).*

* cited by examiner

DRIVING APPARATUS, EXPOSURE APPARATUS, AND ARTICLE MANUFACTURING METHOD

BACKGROUND OF THE INVENTION

Field of the Invention

The present invention relates to a driving apparatus, an exposure apparatus, and an article manufacturing method.

Description of the Related Art

An exposure apparatus, which is used in a lithography step during the manufacture of a micro device such as a semiconductor device, can be used to transfer an original including many fine patterns to a substrate. In order to accurately form the fine patterns, it is important to reduce aberrations (for example, distortion) of a projection optical system responsible for pattern transfer in the exposure apparatus.

Aberrations of the projection optical system depend on the refractive index, surface shape, position, and the like of each of a plurality of optical elements forming the projection optical system. In an assembly stage, it is necessary to assemble the plurality of optical elements with accurate positions. After the assembly, the performance of the projection optical system is measured, and the positions of the optical elements can be adjusted based on the measured result. After the assembly of the projection optical system, in order to correct fluctuations caused by external disturbances such as an impact on the projection optical system during transportation and a temperature change in the exposure apparatus, the positions of all or some of the plurality of optical elements can be adjusted.

Japanese Patent Laid-Open No. 2004-31491 describes an optical system lens barrel including a holding mechanism of an optical element and a shape adjustment mechanism for adjusting the shape of the optical element. The shape adjustment mechanism corrects a shape error of the optical element by applying a moment to the held portion of the optical element. The holding mechanism includes a holding member that holds an end portion of the optical element, and an elastic support member that supports the holding member. The elastic support member supports the holding member with high rigidity in the gravity direction but flexibly in the horizontal direction. The shape adjustment mechanism includes an actuator that applies a horizontal displacement to the elastic support member.

In a driving apparatus that supports an object to be driven by an elastic member alone, by decreasing the rigidity in a driving direction, the object can be driven in a longer stroke without increasing a thrust. However, at the same time, the rigidity in a non-driving direction can also decrease, and this can cause an increase in driving error in the non-driving direction. The increase in driving error in the non-driving direction can be caused by the actuator also generating a force in the non-driving direction in addition to the driving direction, a mounting error of the elastic member, and the like.

Even if the width parameter, length parameter, and thickness parameter of the elastic deformation portion of the elastic member are changed, the rigidities in the respective directions of the plurality directions cannot be adjusted individually. Therefore, in the driving apparatus that supports the object by the elastic member alone, it is difficult to implement a wide movable range in the driving direction and implementing a high rigidity in the direction other than the driving direction.

SUMMARY OF THE INVENTION

The present invention provides a technique advantageous in implementing a wide movable range in a direction of driving an object to be driven and implementing a high rigidity in a direction other than the driving direction.

A first aspect of the present invention provides a driving apparatus comprising: a holding member configured to hold an object to be driven; a support member configured to support the holding member via an elastic member; a plurality of actuators configured to drive the holding member holding the object; and a constrainer configured to constrain, in a non-contact manner, a position of the holding member with respect to the support member in a non-driving direction different from a drivable direction which is a direction in which the holding member can be driven by the plurality of actuators.

A second aspect of the present invention provides an exposure apparatus including a projection optical system that projects a pattern of an original onto a substrate, wherein the projection optical system includes a driving apparatus as defined as the first aspect, and the driving apparatus is configured to drive, as an object to be driven, an optical element of the projection optical system.

A third aspect of the present invention provides an article manufacturing method including: preparing an exposure apparatus as defined as the second aspect; exposing a substrate using the exposure apparatus; developing the substrate having undergone the exposing; and obtaining an article by processing the substrate having undergone the developing.

Further aspects of the present invention will become apparent from the following description of exemplary embodiments with reference to the attached drawings.

DESCRIPTION OF THE EMBODIMENTS

Figure 1A:
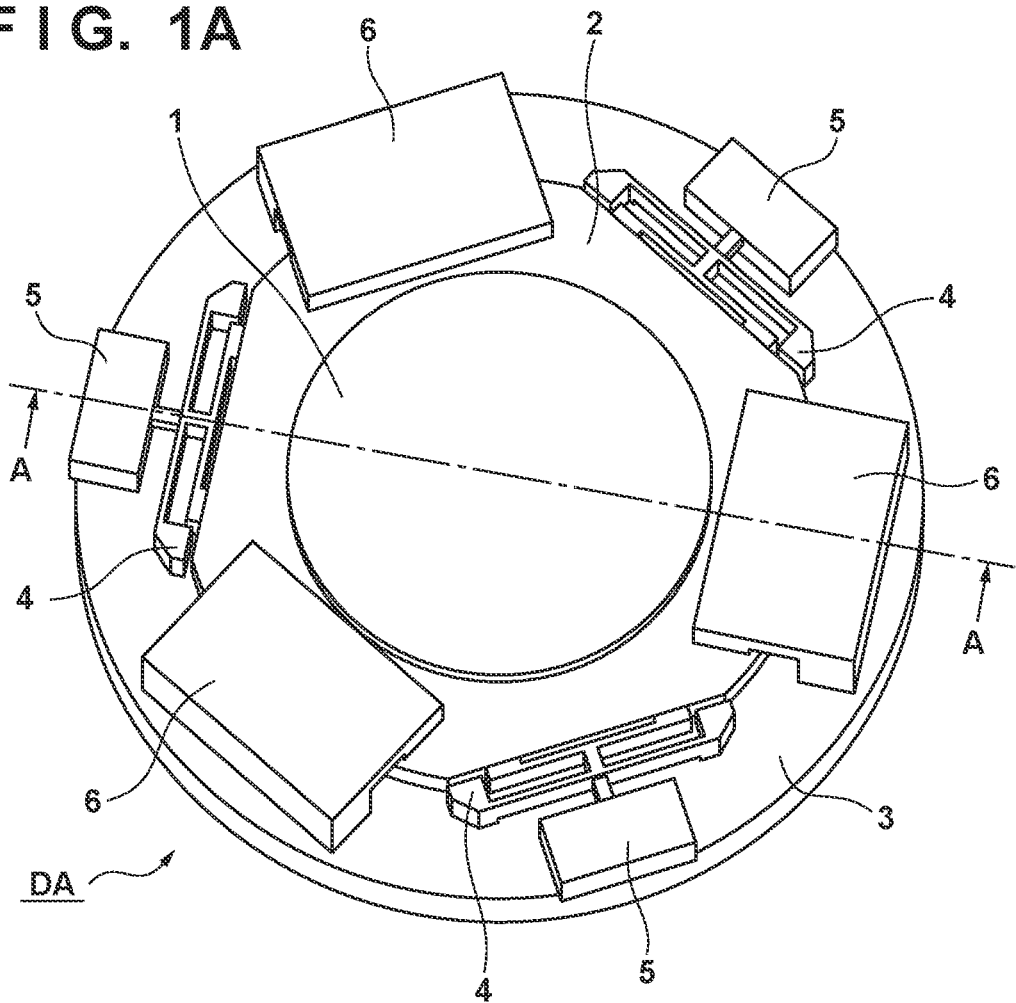
FIGS. 1A and 1B are views showing the arrangement of a driving apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features be combined as appropriate. Furthermore, in the attached drawings, the same reference numerals are given to the same or similar configurations, and redundant description thereof is omitted.

Figure 1B:
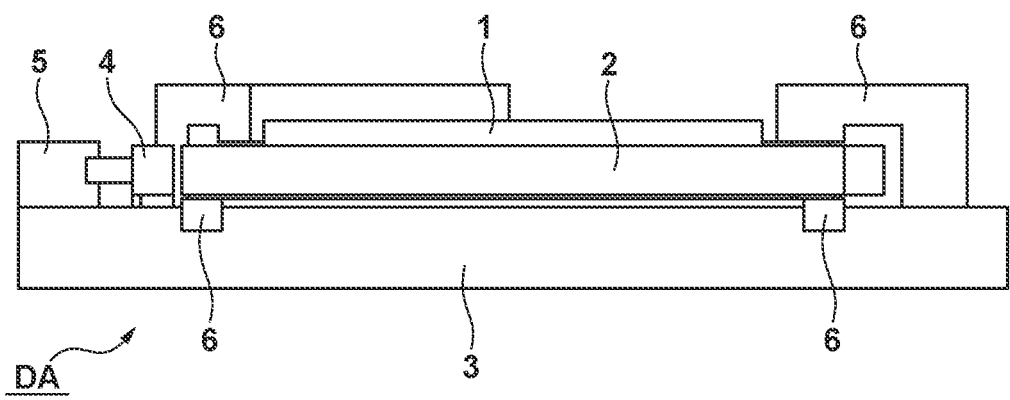

FIG. 1A is a perspective view of a driving apparatus DA according to the first embodiment, and FIG. 1B is a sectional view taken along a line A-A in FIG. 1A. The driving apparatus DA can be configured to drive an object 1 to be driven while supporting the object 1. The object 1 can be, for example, an optical element. For example, the optical element can be any one of a lens, parallel plate glass, a prism, a mirror, a reticle, and a diffractive optical element (for example, binary optics). The object 1 can have, for example, a circular shape or a polygonal (for example, rectangular) shape.

The driving apparatus DA can include a holding member 2 that holds the object 1, a support member 3 that supports the holding member 2 via an elastic member 4, and a plurality of actuators 5 that drive the holding member 2 holding the object 1. The driving apparatus DA can also include a noncontact constrainer 6 that constrains the position of the holding member 2 with respect to the support member 3 in a non-driving direction different from a drivable direction as a direction in which the holding member 2 can be driven by the plurality of actuators 5. Each of the holding member 2 and the support member 3 can have a shape inscribed in a figure similar to the outer shape of the object 1.

The drivable direction as a direction in which the holding member 2 can be driven by the plurality of actuators 5 can be a direction of displacement of the holding member 2 caused by driving the holding member 2 by the plurality of actuators 5. The displacement of the object 1 follows the displacement of the holding member 2 holding the object 1. The displacement can include parallel translation (translation motion) and rotation. The direction of displacement of the holding member 2 caused by driving the holding member 2 by the plurality of actuators 5 can be decided by the resultant force of the forces given to the holding member 2 by the plurality of actuators 5. Accordingly, the drivable direction, which is the direction in which the holding member 2 can be driven by the plurality of actuators 5, can include a plurality of directions. The non-driving direction is a direction different from any of the plurality of directions.

For example, the drivable direction can be an arbitrary direction along a predetermined plane, and the non-driving direction can be a direction orthogonal to the predetermined plane. The drivable direction can include at least one of a translation direction along the predetermined plane and a rotational direction around an axis orthogonal to the predetermined plane. An individual driving direction, which is a direction in which each of the plurality of actuators 5 applies a thrust on the holding member 2, can be included in the drivable direction (the plurality of directions included therein).

The elastic member 4 can have a characteristic, structure, or shape with which the elastic member 4 is easily deformed in the drivable direction or a specific direction in the drivable direction but difficult to be deformed in the non-driving direction. The elastic member 4 can be, for example, a leaf spring, but may have another structure. In the first embodiment, the holding member 2 holding the object 1 is supported by the support member 3 via a plurality of the elastic members 4 and constrained or supported by the noncontact constrainer 6 in the non-driving direction. The elastic member 4 may include a plurality of deformation portions in the elastic member 4 so as to be capable of changing the direction of the force applied to the holding member 2 and/or multiplying the force. In the example shown in FIGS. 1A and 1B, three elastic members 4 are mounted on the driving apparatus DA. However, the driving apparatus DA is only required to include at least one elastic member 4 which is deformable in multiple directions belonging to the drivable direction. In an example, a plurality of the elastic members 4 can be provided such that one elastic member 4 corresponds to one actuator 5.

In the example shown in FIGS. 1A and 1B, each actuator 5 is configured to apply a force to the holding member 2 via the elastic member 4. However, each actuator 5 may be arranged so as to apply a force to the holding member 2 without intervening the elastic member 4, or each actuator 5 may be arranged so as to directly apply a force to the holding member 2. In this case, the object 1 is driven such that the force applied by each of the plurality of actuators 5 to the object 1 and the restoring force applied by each of the plurality of elastic members 4 to the object 1 are balanced. Some of the plurality of actuators 5 may be arranged so as to apply forces to the holding member 2 via the elastic members 4 and remaining ones of the plurality of actuators 5 may be arranged so as to apply forces to the holding member 2 without intervening the elastic members 4.

In the example shown in FIGS. 1A and 1B, the thrust direction of each of the plurality of actuators 5 is directed to the center of the object 1, and a multiaxial driving mechanism that can drive the object 1 in one plane is formed. In the example shown in FIGS. 1A and 1B, three actuators 5 are provided. However, in order to displace the holding member 2 (object 1) in multiple directions, it is only required to provide at least as many actuators 5 as the degrees of freedom of driving. The mounting positions, number, and thrust directions of the actuators 5 can be decided in accordance with the specifications required for the multiaxial driving mechanism.

The noncontact constrainer 6 can constrain or support the holding member 2 in a non-contact manner in the non-driving direction. In another point of view, the support member 3 can constrain or support the holding member 2 via the non-contact constrainer 6 in a non-contact manner in the non-driving direction. The noncontact constrainer 6 is supported by the support member 3. The noncontact constrainer 6 can be configured so as to sandwich a part of the object 1 via gaps in the non-driving direction. In the example shown in FIGS. 1A and 1B, the noncontact constrainer 6 is configured to constrain the object 1 in one plane, but the degree of freedom of the posture of the object 1 constrained by the noncontact constrainer 6 can be arbitrarily decided. For example, the noncontact constrainer 6 may be a multiaxial driving mechanism that constrains, in a non-contact manner, an end portion of the object 1 in the non-driving direction.

For example, the noncontact constrainer 6 may include a gas type constrainer that constrains or supports the holding member 2 by a pressure of compressed air. Alternatively, the noncontact constrainer 6 may include a magnet type constrainer that constrains or supports the holding member 2 by a magnetic force. The gas type constrainer may be a static pressure type constrainer that is provided with a flow path formed by an orifice or a porous material on the fixed side and injects compressed air, or may be a dynamic pressure type constrainer that compresses air by driving a movable body. The static pressure type constrainer is suitable for a form in which the driving amount is regulated by the elastic member 4. The holding member 2 may be constrained or supported using not a gas but a liquid, but in this case, the influence of friction increases so that the positioning accuracy can decrease. In addition, when using a liquid, a sealed structure and a liquid collection structure are required. Note that when using a rolling body in place of a liquid, by performing minute repeated driving on a part of a rolling surface, problems such as uneven lubrication can occur.

According to the structure in which the noncontact constrainer 6 constrains or supports the holding member 2 in a non-contact manner in the non-driving direction, it is possible to increase the rigidity in the non-driving direction without deterioration of the driving accuracy due to friction.

As has been described above, according to the first embodiment, it is possible to increase a ratio of the rigidity in the non-driving direction to the rigidity in the driving direction. Thus, it is possible to suppress a driving error in the thrust direction of the actuator and a driving error in the non-driving direction that can be generated due to errors in the manufacture and assembly of the elastic member. In addition, it is possible to suppress a decrease in position stability in the non-driving direction caused by vibrations from the surroundings. In addition, by ensuring the rigidity in the non-driving direction by the noncontact constrainer 6, it is also possible to decrease the rigidity of the elastic member 4. With this, the displacement amount can be increased without increasing the thrust, and the stress in the deformation portion of the elastic member can be reduced. This can increase the drive stroke. Further, since the elastic member has position reproducibility in a state in which no force is applied thereto, the state in which no force is applied to the elastic member can be used as the semi-position of the driving apparatus.

Figure 2A:
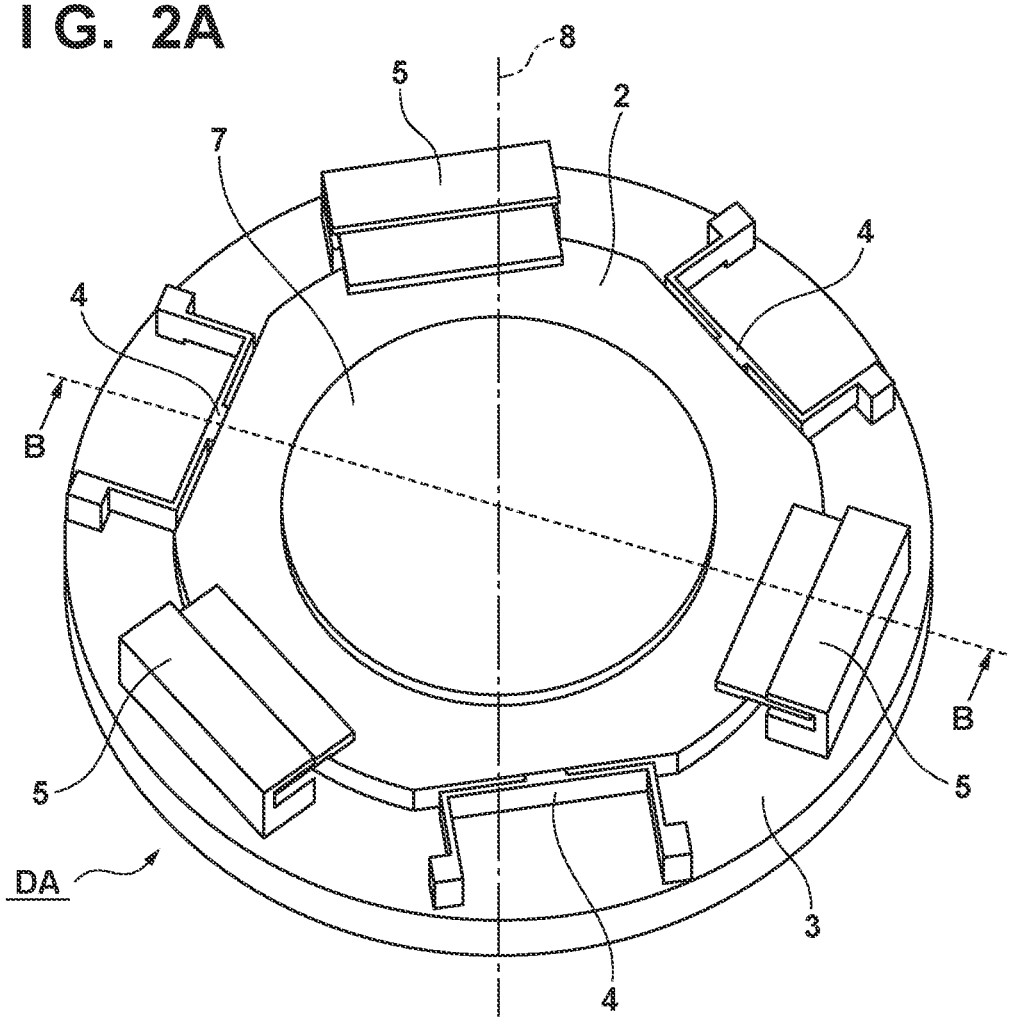
FIGS. 2A and 2B are views showing the arrangement of a driving apparatus according to the second embodiment.
Figure 2B:
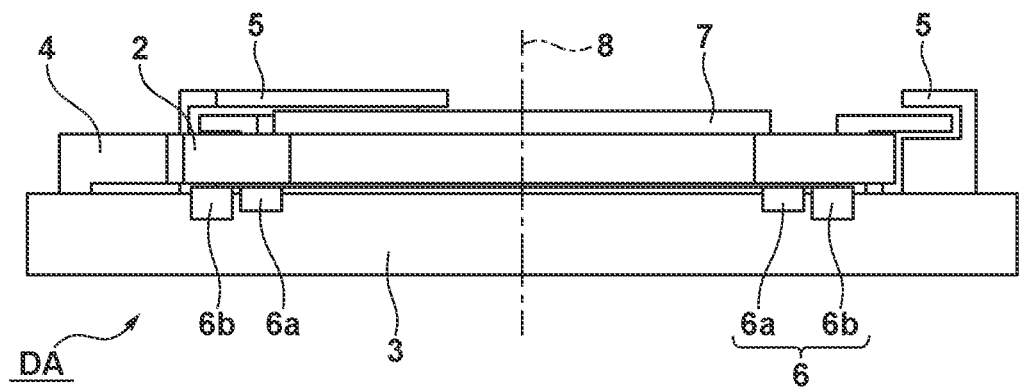

FIG. 2A is a perspective view of a driving apparatus DA according to the second embodiment, and FIG. 2B is a sectional view taken along a line B-B in FIG. 2A. Matters not mentioned as the second embodiment can follow the first embodiment. The driving apparatus DA can be configured to drive an optical element 7 as an object to be driven while supporting the optical element 7. Fax example, the optical element 7 can be any one of a lens, parallel plate glass, a prism, a mirror, a reticle, and a diffractive optical element (for example, binary optics). The optical element 7 has an optical axis 8. In the example shown in FIGS. 2A and 2B, the optical element 7 has a disk shape with the optical axis 8 as the center, but the position of the optical axis 8 and the shape of the optical element 7 vary depending on the application. For example, when the optical element 7 is a reticle, it generally has a rectangular shape.

The driving apparatus DA can include a holding member 2 that holds the optical element 7, a support member 3 that supports the holding member 2 via an elastic member 4, and a plurality of actuators 5 that drive the holding member 2 holding the optical element 7. The driving apparatus DA can also include a noncontact constrainer 6 that constrains, in a non-contact manner, the position of the holding member 2 with respect to the support member 3 in a non-driving direction different from a drivable direction as a direction in which the holding member 2 can be driven by the plurality of actuators 5. The drivable direction as a direction in which the holding member 2 can be driven by the plurality of actuators 5 can be a direction of displacement of the holding member 2 caused by driving the holding member 2 by the plurality of actuators 5. The displacement of the optical element 7 follows the displacement of the holding member 2 holding the optical element 7.

In the example shown in FIGS. 2A and 2B, the thrust direction of each of the plurality of actuators 5 is directed to the center of the optical element 7, so that the holding member 2 (optical element 7) can be driven with respect to two translational axes in a plane orthogonal to the optical axis 8. If the thrust direction of each of the plurality of actuators 5 is parallel to the tangent direction of the optical element 7, the optical element 7 can be driven with respect to two translational axes in a plane orthogonal to the optical axis 8, and rotation around the optical axis 8. In the example shown in FIGS. 2A and 2B, a multiaxial driving mechanism is formed by three elastic members 4 and three actuators 5, but the number of the elastic members 4 and the number of actuators 5 can be decided in accordance with the specifications required for the multiaxial driving mechanism.

The noncontact constrainer 6 can be configured to constrain or support the holding member 2 in a direction parallel to the optical axis 8. The noncontact constrainer 6 can include a first portion 6a and a second portion 6b that apply forces to the holding member 2 in the same direction (the direction parallel to the optical axis 8). The first portion 6a and the second portion 6b can be arranged in a direction orthogonal to the optical axis 8 or in a radial direction of the optical element 7. One of the first portion 6a and the second portion 6b can apply a repulsive force to the holding member 2, and the other can apply an attractive force to the holding member 2. Such an arrangement is advantageous in decreasing the thickness of the noncontact constrainer 6 or the driving apparatus DA.

In an optical system incorporating the driving apparatus DA, a plurality of optical elements can be arranged in a space from an object plane to an image plane. In a case of a projection optical system of an exposure apparatus, for example, about 10 to 30 optical elements can be arranged, and the pattern of a reticle arranged on the object plane can be projected onto the image plane. In such an optical system incorporating a large number of optical elements, it is desired to decrease the thickness of the driving apparatus DA in a direction parallel to the optical axis 8.

When an external disturbance in a direction parallel to the optical axis 8 is added to the driving apparatus DA, the first portion 6a and the second portion 6b forming the noncontact constrainer 6 are required to maintain the constrained state of the holding member 2 by balancing the repulsive force and the attractive force. One of the first portion 6a and the second portion 6b can generate a force for constraining the holding member 2 using a gas, and the other of the first portion 6a and the second portion 6b can generate a force for constraining the holding member 2 using a magnetic force. For example, one of the first portion 6a and the second portion 6b can be formed as a repulsive force generator that generates a force in a direction for increasing a gap between the noncontact constrainer 6 and the holding member 2, that is, a repulsive force by supplying compressed air to the gap. The other of the first portion 6a and the second portion 6b can be formed as an attractive force generator that generates a force in a direction for decreasing the gap between the noncontact constrainer 6 and the holding member 2, that is, an attractive force by a magnetic force. Each of the repulsive force generator and the attractive force generator can be formed to have a ring shape. The repulsive force generator is preferably arranged on the inner side of the attractive force generator.

In an example, each of the first portion 6a and the second portion 6b has a ring shape, the first portion 6a is arranged on the inner side of the second portion 6b, the first portion 6a is formed as a repulsive force generator that generates a repulsive force by a gas, and the second portion 6b is formed as an attractive force generator that generates an attractive force by a magnetic force. The first portion 6a and the second portion 6b can be arranged concentrically. With the arrangement as described above, distortion (deformation) that can be given to the optical element 7 by the noncontact constrainer 6 via the holding member 2 can be limited to a component axisymmetric with respect to the optical axis S. In an optical system incorporating the optical element 7 or the driving apparatus DA, aberrations of the optical system that can be generated due to axisymmetric distortion (deformation) of the optical element 7 can be easily corrected. This can be performed by adjusting the position of at least one optical element, of the plurality of optical elements forming the optical system, in the optical axis direction, or by driving an optical element for correcting an image plane aberration or a spherical aberration.

In a state in which no force is applied, the elastic member 4 has high position reproducibility. In a state in which the actuator 5 is not operating (in a state in which a force generated by the actuator 5 is zero), the optical element 7 is arranged at a position determined by the displacement balanced position of the elastic member 4. The position of the optical element 7 determined by the displacement balanced position of the elastic member 4 can be used as a reference position. If the optical element 7 is in the reference position, it is possible to advance assembly of the optical system in this state, After the optical element is mounted on an apparatus, for example, an exposure apparatus, the reference position can be used as the position origin of the driving apparatus DA when restoring the performance of the apparatus.

In order to reproduce the reference position with high accuracy, it is desirable that, in a state in which power supply to the actuator 5 is cut off to remove a force generated by the actuator 5, the actuator 5 has no resistance that impairs the position reproducibility of the elastic member 4. The resistance that impairs the position reproducibility of the elastic member 4 can be, for example, a holding force in the state in which power supply to the actuator 5 is cut off. For example, there are a harmonic gear and a linear motion screw, each of which is held by a friction force, a worm gear exerting a self-locking effect, or the like. A linear motor is suitable because it is formed from a noncontact coil and a magnet and uses a force generated by current supply as a thrust. A stacked piezoelectric element generates a thrust that extends in accordance with voltage supply, and has no internal resistance. Therefore, the stacked piezoelectric element can be used while paying attention to the particular hysteresis. Even another actuator can be used unless the internal resistance in the state in which the power supply is cut off prevents the elastic member 4 from returning the optical element 7 to the reference position.

In the driving apparatus DA shown in FIGS. 2A and 2B, both the elastic member 4 and the noncontact constrainer 6 constrain or support the holding member 2 in the direction parallel to the optical axis 8. The overall support rigidity of the driving apparatus DA can be regarded as the parallel support rigidity of the elastic member 4 and the noncontact constrainer 6. Therefore, the rigidity of the elastic member 4 in the non-driving direction is preferably smaller than the rigidity of the noncontact constrainer 6 in the non-driving direction. For example, an arrangement in which, in a state in which the repulsive force generator is not operated, the holding member 2 is supported by the support member 3 while being in contact with at least one of the support member 3 and the noncontact constrainer 6 due to an attractive force generated by the attractive force generator is advantageous in assembly, transportation, and storage.

In the second embodiment, the rigidity in the non-driving direction is increased by the noncontact constrainer 6. On the other hand, when increasing the drive stroke of the optical element 7 by the actuator 5, the rigidity in the drive direction can decrease accordingly. Therefore, in a situation in which power supply to the actuator 5 having a function of position holding is cut off, for example, during assembly, transportation, and storage of the optical system, the optical element 7 can be vibrated largely due to an external disturbance. Particularly, in an application to an exposure apparatus, an impact on the projection optical system during transportation is extremely larger than an impact received by the projection optical system within the exposure apparatus during normal use, and the holding member 2 can collide with a limit part regulating the movable range many times. However, since the driving apparatus DA is incorporated in the projection optical system, it is difficult to detach a part for fixing the holding member 2. Accordingly, the above-described arrangement in which the holding member 2 is fixed by the attractive force generator without operating the repulsive force generator during assembly, transportation, and storage is advantageous in assembly, transportation, and storage of the projection optical system.

Figure 3:
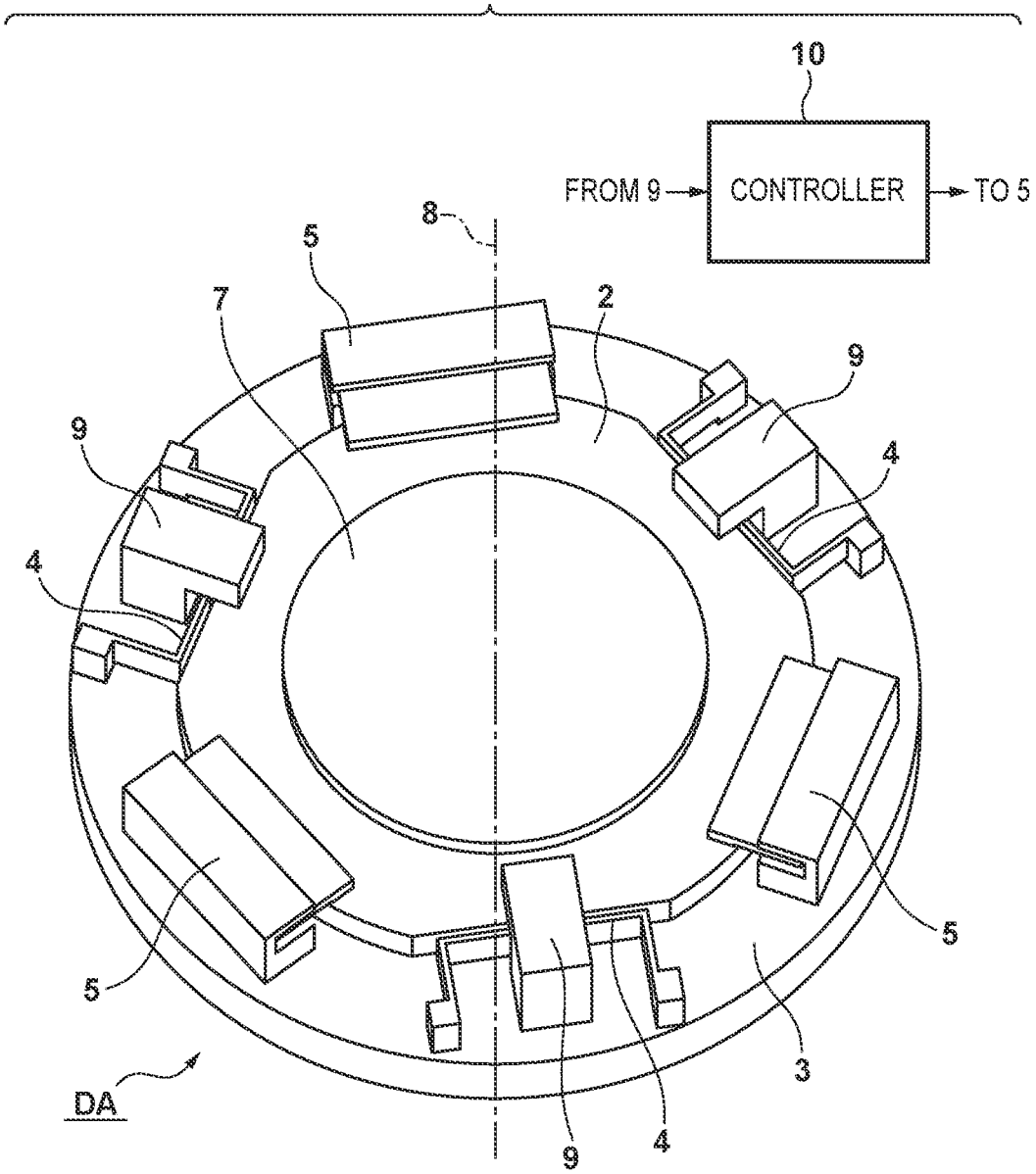
FIG. 3 is a view showing the arrangement of a driving apparatus according to the third embodiment.

FIG. 3 is a perspective view of a driving apparatus DA according to the third embodiment. Matters not mentioned as the third embodiment can follow the second embodiment. The driving apparatus DA according to the third embodiment has an arrangement in which one or a plurality of sensors 9 and a controller 10 are added to the driving apparatus DA according to the second embodiment. The one or plurality of sensors 9 can be configured to detect the change amount of the relative position of an optical element 7 or a holding member 2 with respect to a support member 3, or the relative position of the optical element 7 or the holding member 2 with respect to the support member 3. The sensor 9 can be, for example, a displacement sensor.

The controller 10 can be configured to perform feedback control of a plurality of actuators 5 based on outputs from the one or plurality of sensors 9 such that the optical element 7 or the holding member 2 achieves a target state (target position and/or target rotational angle). With this, for example, the performance of an optical system such as a projection optical system incorporating the optical element 7 or the driving apparatus DA can be maintained at the target performance.

Figure 4:
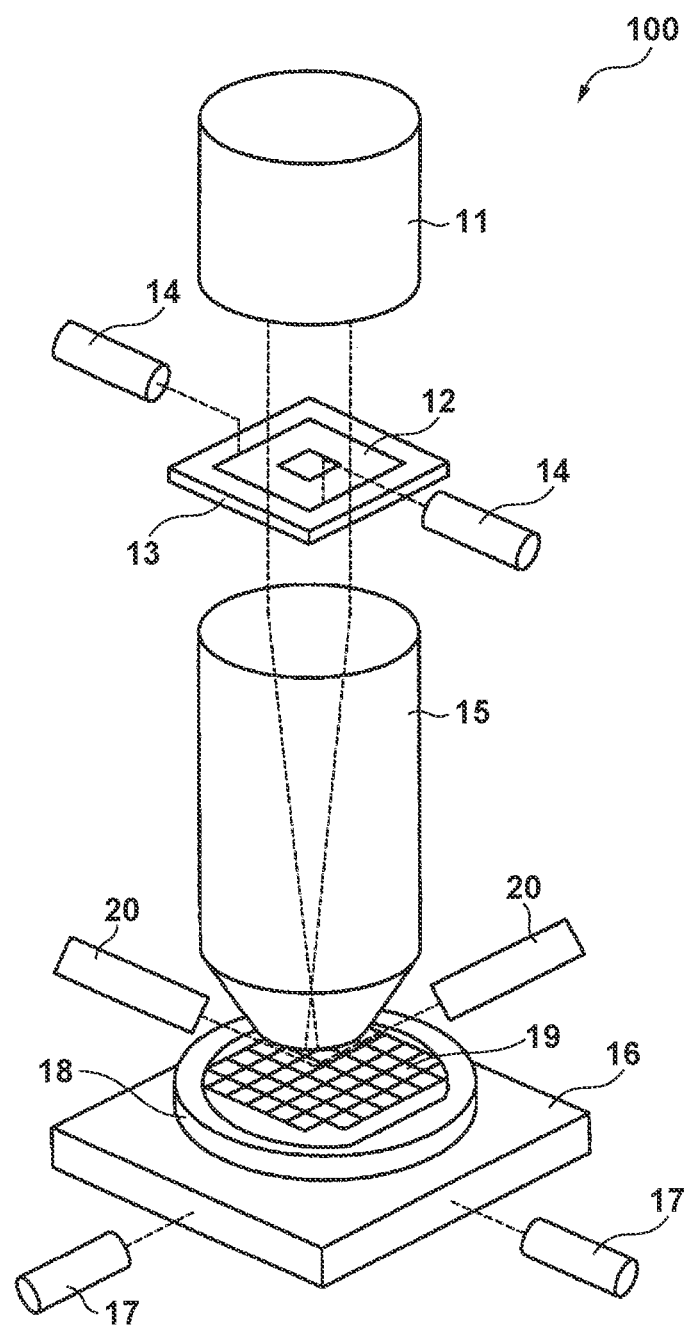
FIG. 4 is a view showing the arrangement of an exposure apparatus according to an embodiment.

FIG. 4 illustrates the arrangement of an exposure apparatus 100 including a projection optical system 15 incorporating the driving apparatus DA represented by the second embodiment or the third embodiment. The exposure apparatus 100 is configured to project the pattern of an original (reticle) 12 onto a substrate (wafer) 19 by the projection optical system 15, thereby exposing the substrate 19.

In addition to the projection optical system 15, the exposure apparatus 100 can include, for example, an illumination optical system 11, an original stage 13, a substrate stage 16, an original position measurement device 14, a substrate position measurement device 17, a focus measurement device 20, and the like. The illumination optical system 11 illuminates the original 12 held by the original stage 13, and the projection optical system 15 projects the pattern of the illuminated original 12 onto the substrate 19 held by a substrate chuck 18 of the substrate stage 16. The original position measurement device 14 measures the position of the original stage 13. The substrate position measurement device 17 measures the position of the substrate stage 16. The focus measurement device 20 measures the height of the substrate 19.

The projection optical system 15 can incorporate at least one driving apparatus DA together with the optical element 7. The driving apparatus DA is advantageous in adjustment of the position of the optical element 7 with high accuracy. Work to disassemble the projection optical system 15 for conveyance of the projection optical system 15 and assemble the projection optical system 15 after the conveyance takes long time. By incorporating the driving apparatus DA in the projection optical system 15, it is possible to eliminate the need for disassembly and assembly of the projection optical system 15.

An article manufacturing method of manufacturing an article using the exposure apparatus 100 will be described below. The article can be, for example, a semiconductor device or a display device, but may be another device. The article manufacturing method can include a preparing step of preparing the exposure apparatus 100, an exposing step of exposing a substrate using the exposure apparatus 100, a developing step of developing the substrate exposed in the exposing step, and a processing step of obtaining an article by processing the substrate having undergone the developing step. The substrate to be provided to the exposing step includes a photosensitive material, and a latent image is formed in the photosensitive material by exposure in the exposing step. The latent image is converted into a physical pattern by the developing step. The processing step can include, for example, an etching step, a film formation step, a dicing step, and the like. In general, the exposing step and the developing step are repeatedly performed. This article manufacturing method is advantageous preparing and adjusting the exposure apparatus 100 in a short period and accordingly manufacturing an article in a short period.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-138249, filed Aug. 26, 2021, which is hereby incorporated by reference herein in its entirety.

What is claimed is:

1. A driving apparatus comprising:
   a holding member configured to hold an object to be driven;
   a support member configured to support the holding member via an elastic member;
   a plurality of actuators configured to drive the holding member holding the object; and
   a constrainer configured to constrain, in a non-contact manner, a position of the holding member with respect to the support member in a non-driving direction different from a drivable direction which is a direction in which the holding member can be driven by the plurality of actuators,
   wherein the constrainer includes a repulsive force generator configured to generate a repulsive force for constraining the holding member by a gas, and an attractive force generator configured to generate an attractive force for constraining the holding member by a magnetic force,
   wherein the holding member has a first surface and the support member has a second surface facing the first surface of the holding member, and the repulsive force generator and the attractive force generator are arranged on the second surface of the support member so as to face the first surface of the holding member, and
   wherein the plurality of actuators are arranged on the second surface of the support member.

2. The apparatus according to claim 1, wherein each of the plurality of actuators applies a force to the holding member in a direction along a predetermined plane, and the non-driving direction is a direction orthogonal to the predetermined plane.

3. The apparatus according to claim 2, wherein the drivable direction includes a translation direction along the predetermined plane.

4. The apparatus according to claim 2, wherein the drivable direction includes a rotational direction around an axis orthogonal to the predetermined plane.

5. The apparatus according to claim 2, wherein the drivable direction includes a translation direction along the predetermined plane and a rotational direction around an axis orthogonal to the predetermined plane.

6. The apparatus according to claim 1, wherein the support member supports the holding member via a plurality of elastic members including the elastic member, and each of the plurality of actuators drives the holding member via at least one of the plurality of elastic members.

7. The apparatus according to claim 1, wherein the support member supports the holding member via a plurality of elastic members including the elastic member, and the plurality of actuators and the plurality of elastic members are provided such that one elastic member corresponds to one actuator, and each actuator drives the holding member via the corresponding elastic member.

8. The apparatus according to claim 1, wherein the support member supports the holding member via a plurality of elastic members including the elastic member, and each of the plurality of actuators drives the holding member without intervening any of the plurality of elastic members.

9. The apparatus according to claim 1, wherein the holding member has a third surface opposite to the first surface, and a part of each of the plurality of actuators is arranged on the third surface.

10. The apparatus according to claim 9, wherein the object is an optical element, and the constrainer is configured to constrain the holding member in a direction parallel to an optical axis of the optical element, and no constrainer is arranged on the third surface.

11. The apparatus according to claim 10, wherein the repulsive force generator and the attractive force generator are arranged in a direction orthogonal to the optical axis.

12. The apparatus according to claim 10, wherein the repulsive force generator and the attractive force generator are arranged in a radial direction of the optical element.

13. The apparatus according to claim 12, wherein each of the repulsive force generator and the attractive force generator has a ring shape.

14. The apparatus according to claim 13, wherein the repulsive force generator is arranged on an inner side of the attractive force generator.

15. The apparatus according to claim 13, wherein in a state in which the repulsive force generator is not operating, the holding member is supported by the support member while being in contact with at least one of the support member and the constrainer.

16. The apparatus according to claim 1, wherein in a state in which the plurality of actuators are not operating, the object is arranged at a position determined by a displacement balanced position of the elastic member.

17. The apparatus according to claim 1, wherein
a rigidity of the elastic member in the non-driving direction is smaller than a rigidity of the constrainer in the non-driving direction.

18. The apparatus according to claim 1, further comprising
a sensor configured to detect a relative position of the holding member with respect to the support member,
wherein the plurality of actuators are controlled based on an output of the sensor.

19. An exposure apparatus including a projection optical system that projects a pattern of an original onto a substrate, wherein
the projection optical system includes a driving apparatus defined in claim 1, and
the driving apparatus is configured to drive, as an object to be driven, an optical element of the projection optical system.

20. An article manufacturing method including:
preparing an exposure apparatus defined in claim 19;
exposing a substrate using the exposure apparatus;
developing the substrate having undergone the exposing; and
obtaining an article by processing the substrate having undergone the developing.

\* \* \* \* \*